(12) United States Patent
Akter et al.

(10) Patent No.: US 9,853,615 B2
(45) Date of Patent: Dec. 26, 2017

(54) LINEARIZED DYNAMIC AMPLIFIER

(71) Applicant: BROADCOM CORPORATION, Irvine, CA (US)

(72) Inventors: Md Shakil Akter, Utrecht (NL); Klaas Bult, Bosch en Duin (NL)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 15/139,030

(22) Filed: Apr. 26, 2016

(65) Prior Publication Data

US 2017/0302237 A1    Oct. 19, 2017

Related U.S. Application Data

(60) Provisional application No. 62/321,809, filed on Apr. 13, 2016.

(51) Int. Cl.
*H03F 3/45* (2006.01)
*H03M 1/12* (2006.01)
(Continued)

(52) U.S. Cl.
CPC ....... *H03F 3/45076* (2013.01); *H03F 1/0205* (2013.01); *H03M 1/124* (2013.01);
(Continued)

(58) Field of Classification Search
CPC ...... H03F 3/45076; H03F 1/0205; H03F 3/45; H03F 3/45071; H03F 3/45179;
(Continued)

(56) References Cited

U.S. PATENT DOCUMENTS

| | | | | |
|---|---|---|---|---|
| 6,542,019 B1 * | 4/2003 | Lim | ................... | H03D 7/1441 327/359 |
| 8,319,555 B1 * | 11/2012 | Heikkinen | .............. | H03F 1/565 330/283 |
| 9,281,785 B2 * | 3/2016 | Sjoland | ................... | H03F 1/303 |

OTHER PUBLICATIONS

Akter; A 66 dB SNDR Pipelined Split-ADC Using Class-AB Residue Amplifier With Analog Gain Correction; European Solid-State Circuits Conference (ESSCIRC); Sep. 2015; pp. 315-318.
(Continued)

*Primary Examiner* — Khanh V Nguyen
(74) *Attorney, Agent, or Firm* — Garlick & Markison; Bruce E. Garlick

(57) ABSTRACT

A differential amplifier includes a positive leg, a negative leg, and biasing circuitry. The positive leg includes at least one positive leg transistor, a first positive leg degeneration capacitor, and positive leg degeneration capacitor biasing circuitry configured to bias the first degeneration capacitor during a reset period. The negative leg includes at least one negative leg transistor, a negative leg degeneration capacitor, and negative leg degeneration capacitor biasing circuitry configured to bias the negative leg degeneration capacitor during the reset period. The biasing circuitry biases current of both the at least one positive leg transistor and the at least one negative leg transistor based on capacitance of the first positive leg degeneration capacitor, capacitance of the first negative leg degeneration capacitor, and a sampling time during an amplification period. The differential amplifier may be a stage amplifier in an Analog to Digital Converter (ADC).

17 Claims, 10 Drawing Sheets

(51) Int. Cl.
*H03F 1/02* (2006.01)
*H03G 3/30* (2006.01)
*H03F 1/34* (2006.01)
*H03G 1/00* (2006.01)

(52) U.S. Cl.
CPC ................. *H03F 1/34* (2013.01); *H03F 3/45* (2013.01); *H03F 3/45071* (2013.01); *H03F 3/45085* (2013.01); *H03F 3/45179* (2013.01); *H03F 3/45183* (2013.01); *H03F 2200/294* (2013.01); *H03F 2200/372* (2013.01); *H03F 2200/489* (2013.01); *H03F 2203/45296* (2013.01); *H03G 1/0052* (2013.01); *H03G 3/3015* (2013.01)

(58) Field of Classification Search
CPC .. H03F 3/45183; H03F 1/34; H03F 2200/294; H03F 2200/372; H03F 2200/489; H03M 1/124
USPC ................................. 330/261, 283
See application file for complete search history.

(56) References Cited

OTHER PUBLICATIONS

Panigada; A 130 mW 100 MS/s Pipelined ADC With 69 db SNDR Enabled by Digital Harmonic Distortion Correction; IEEE Journal of Solid-State Circuits; vol. 44, No. 12; Dec. 2009; pp. 3314-3328.
Sehgal; A 12 b 53 mW 195 MS/s Pipeline ADC With 82 db SFDR Using Split-ADS Calibration; IEEE Journal of Solid-State Circuits; vol. 50, No. 7; Jul. 2015; pp. 1592-1603.

\* cited by examiner

LINEARIZED DYNAMIC AMPLIFIER

CROSS REFERENCE TO RELATED PATENTS/PATENT APPLICATIONS

Provisional Priority Claim, 35 U.S.C. §119(e)

The present U.S. Utility Patent Application claims priority pursuant to 35 U.S.C. §119(e) to U.S. Provisional Application No. 62/321,809, entitled "LINEARIZED DYNAMIC AMPLIFIER," filed Apr. 13, 2016, which is hereby incorporated herein by reference in its entirety and made part of the present U.S. Utility Patent Application for all purposes.

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

BACKGROUND

Technical Field

This disclosure relates generally to communications and more particularly to amplifiers for use in communication devices.

Description of Related Art

Communication systems are well known and include wireless networks, wired networks, satellite networks, and various other types of networks. Wired networks use wiring or fiber to direct communications between communication devices while wireless networks support communications wirelessly. As communications technology has advanced, integrated circuits have been developed that service both wired and wireless communications. These integrated circuits include a wide variety of circuits wireless and wired interface circuitry and processing circuitry among other types of circuitry. Particular elements of such circuitry include amplifiers. Field Effect Transistors (FETs), e.g., Metal Oxide Silicon (MOS) transistors, are often used as active elements within such amplifiers.

While FET amplifiers are cost effective from an integrated circuit perspective they introduce operational difficulties. FET amplifiers are inherently non-linear across their operational range when used as amplifiers. Such non-linearity of the FET amplifiers may be suppressed using feedback circuitry or digital non-linearity calibration circuitry. Such circuitry not only must be added to the integrated circuit, increasing die area, but consumes power, producing heat, and draining battery of portable communication devices. Further, while such circuitry does not fully address the non-linearity of the FET amplifiers it does introduce noise to the integrated circuit.

BRIEF DESCRIPTION OF THE SEVERAL VIEWS OF THE DRAWING(S)

DETAILED DESCRIPTION OF THE DISCLOSURE

Figure 1:
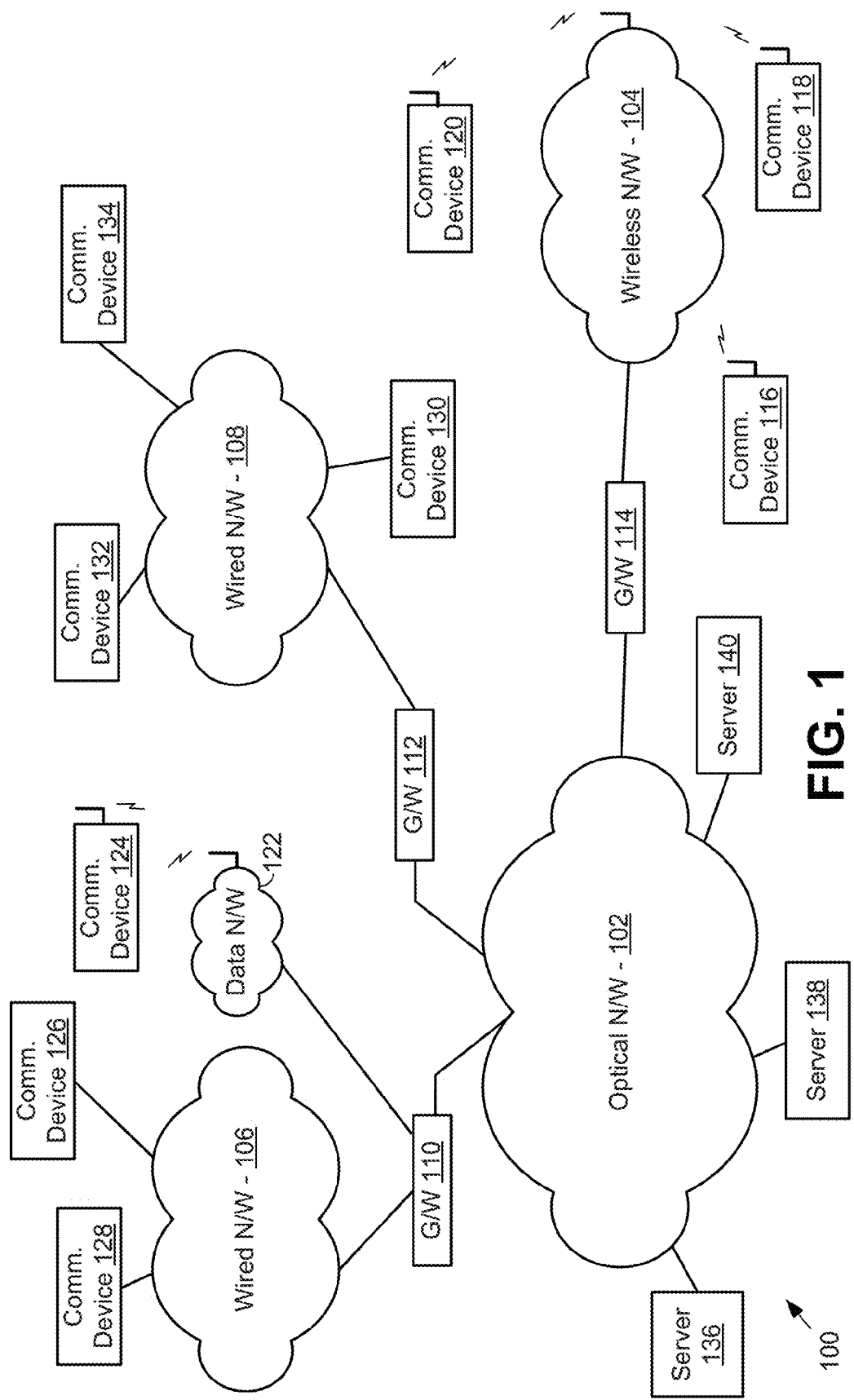
FIG. 1 is a system diagram illustrating a communication system having one or more communication devices constructed and operating according to one or more embodiments of the present disclosure.

FIG. 1 is a system diagram illustrating a communication system 100 having one or more communication devices constructed and operating according to one or more embodiments of the present disclosure. The communication system 100 includes a communication infrastructure that services a plurality of communication devices. The communication infrastructure includes an optical network 102, a wireless network 104, a wired network 106, and a wired network 108. These networks provide a backbone for servicing communications among a plurality of communication devices. The optical network 102 includes optical network components and may also include wired networking components. It operates according to one or more communication standards. Coupled to the optical network are servers 136, 138, and 140, which service various types of communications and/or transactions, e.g., media services, financial transactions, searching, and/or other commerce. Gateways bridge the networks 102, 104, 106 and 108. Gateway 114 bridges communications between optical network 102 and wireless network 104, gateway 110 bridges communications between optical network 102 and wired network 106, and gateway 112 bridges communications between optical network and wired network 108.

Wireless network 104 may be a cellular network, a Wireless Wide Area Network (WWAN), a Wireless Local Area Network (WLAN), a Wireless Personal Area Network (WPAN), a Near Field Communication (NFC) network, a 60 GHz network, or a combination of these. The wireless network 104 supports one or more wireless communication protocols, e.g., IEEE 802.11x, GSM, EDGE, LTE, and/or other wireless communication protocols. The wireless network 104 supports communication devices 116, 118, and 120. These communication devices 116, 118, and 120 may be cell phones, laptop computers, desktop computers, tablet computers, data terminals, or other computing devices that support wireless communications and that may service wired communications.

Wired networks 106 and 108 may be Local Area Networks (LANs), Wide Area Networks (WANs), cable networks, other types of wired networks, and/or a combination of these. Wired network 106 supports standardized wired communications and services communication devices 126 and 128. Wired network 108 supports communication devices 130, 132 and 134. These communication devices 126, 128, 130, 132, and 134 may be computers, home entertainment components, televisions, home gateways, and/or other types of devices that support wired communications (and wireless communications). Wired networks 106 may also support a coupled wireless data network 122, such as a WLAN, a WWAN, a Near Field Communication network, a 60 GHz network, and/or another type of wireless network. The wireless data network 122 supports at least communication device 124. These communication devices may communicate with one another using Bluetooth or other communication protocols as well.

One or more of the communication devices illustrated in FIG. 1 supports both wired and wireless communications. In supporting the wired communications one or more of the communication devices include linearized dynamic amplifiers constructed according to the present disclosure. These linearized dynamic amplifiers may be included in one or more Analog to Digital Converters (ADCs) of the communication devices. These linearized dynamic amplifiers are differential in some embodiments described herein and provide improved performance as compared to prior amplifiers.

Figure 2:
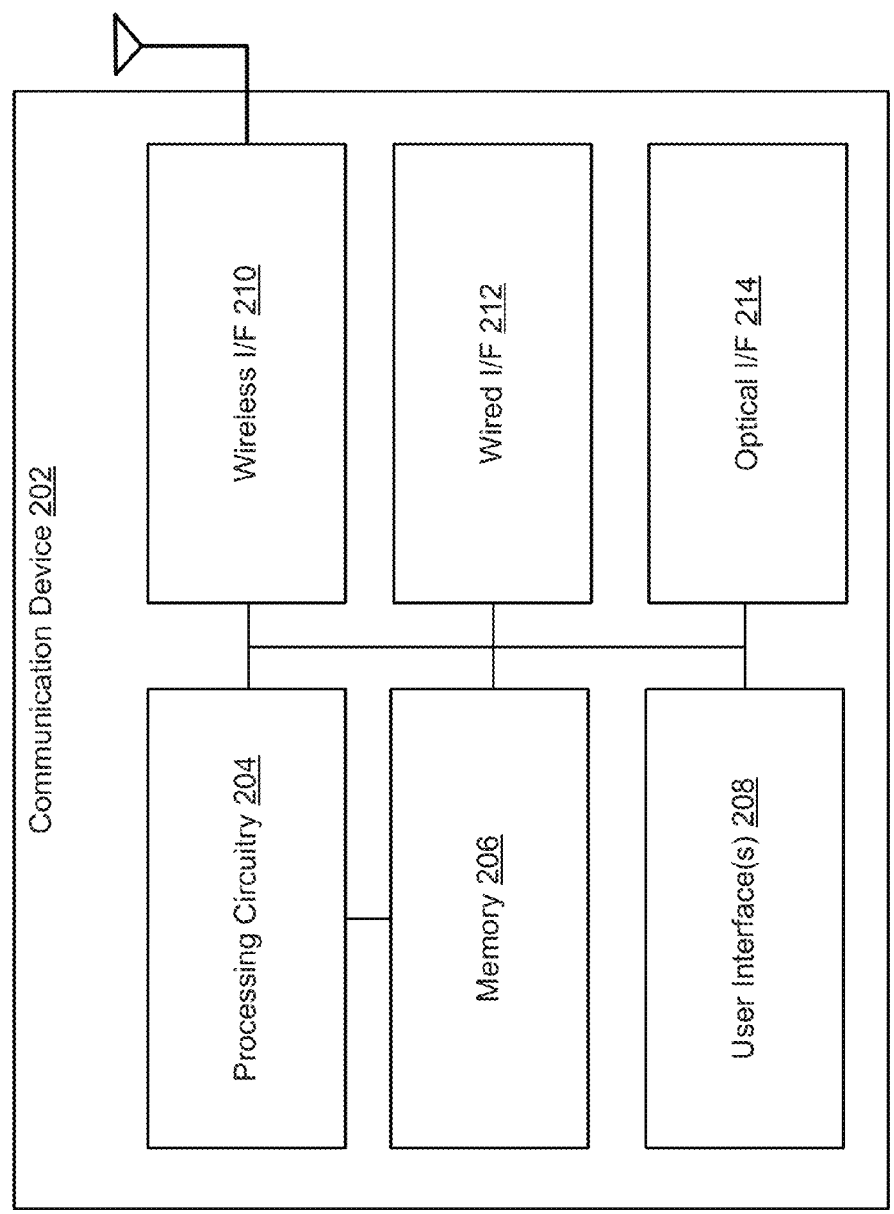
FIG. 2 is a block diagram illustrating components of a communication device constructed and operating according to one or more embodiments of the present disclosure.

FIG. 2 is a block diagram illustrating components of a communication device constructed and operating according to one more embodiments of the present disclosure. The communication device 202 includes processing circuitry 204, memory 206, one or more user interfaces 208, and a wireless interface 210 and includes one or more of a wired interface 212 and an optical interface 214. The communication device may be one of the communication devices illustrated in FIG. 1.

The processing circuitry 204 may be one or more of a microprocessor, a digital signal processor, application specific processing circuitry, and/or other circuitry capable of executing logic operations based upon pre-programmed instructions or the execution of software instructions. The memory 206 may be dynamic RAM, static RAM, flash RAM, ROM, programmable ROM, magnetic storage, optical storage or other storage that is capable of storing instructions and data. The stored data may be audio data, video data, user data, software instructions, configuration data, or other data. The user interface 208 supports one or more of a video monitor, a keyboard, an audio interface, or other user interface device.

The wireless interface 210 supports one or more of cellular communications, WLAN communications, WPAN communications, WWAN communications, 60 GHz communications, NFC communications, and/or other wireless communications. These wireless communications are standardized in most embodiments and proprietary in other embodiments. The wired interface 212 supports wired communications, which may be LAN communications, WAN communications, cable network communications, direct data link communications, or other wired communications. The optical interface 214 supports optical communications, which are standardized in some embodiments and proprietary in other embodiments.

Multiple of the components 204, 206, 208, 210, 212, and 214 of the communication device may be constructed on a single integrated circuit die. It is fairly common to form all communication components, e.g., wireless interface 210, wired interface 212, and optical interface 214 on a single integrated circuit. The wired interface 212 and the optical interface 214 typically service bit stream communications with which data is conveyed. These bit stream communications may be Serializer/Deserializer (SERDES) communications or optical link communications.

Figure 3A:
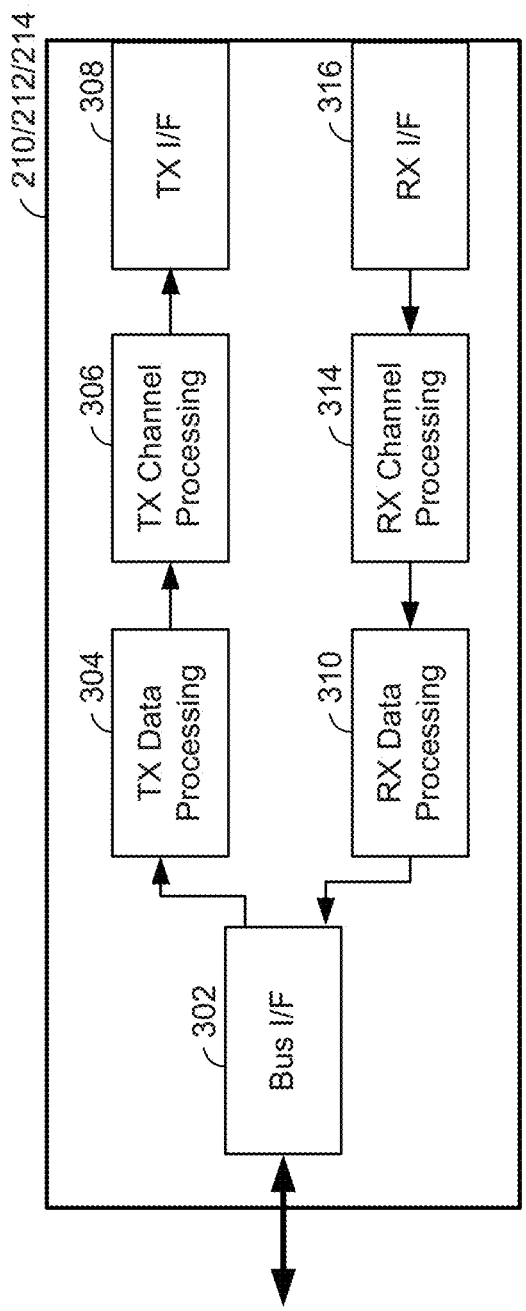
FIG. 3A is a block diagram illustrating a communication interface constructed according to one or more embodiments of the present disclosure.

FIG. 3A is a block diagram illustrating a communication interface constructed according to one or more embodiments of the present disclosure. The communication interface, which represents one or more of wireless interface 210, wired interface 212 or optical interface 214 includes a bus interface 302 that interfaces with processing circuitry of the communication device. The communication interface includes a transmit path and a receive path. The transmit path includes TX data processing 304 that forms data for transmission. The TX data processing 304 may execute one or more protocol layer functions, e.g., Link and/or PHY layer operations, or a portion thereof. In other constructs the TX data processing 304 may service additional operations as well such as session, transport, and network layer operations. TX channel processing 306 performs PHY layer operations in forming data for transmission. The TX interface 308 transitions the data from digital to analog form. Receive path components include an RX interface 316, RX channel processing 314, RX data processing 310 and the bus interface 302. These components perform operations that are complementary to the transmit path operations.

The RX interface 316 includes one or more differential amplifiers constructed and operating according to the present disclosure. As will be described further with reference to FIGS. 3B-7, these differential amplifiers provide improved performance in the amplification of signals, particularly within an ADC. This improved structure may be used with wireless, wired, or optical communications.

Figure 3B:
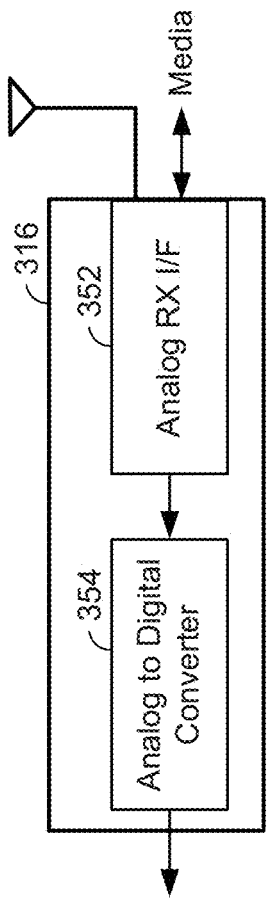
FIG. 3B is a block diagram illustrating a Receive Interface (RX I/F) constructed according to one or more embodiments of the present disclosure.

FIG. 3B is a block diagram illustrating an RX interface constructed and operating according to one or more embodiments of the present disclosure. The RX interface 316 includes an analog RX interface 352 and an ADC 354. The analog RX interface 352 couples to an antenna and/or media, depending upon its use. The structure of the analog RX interface 352 will vary according to its deployed use. The ADC 354 converts information signals from an analog format to a digital format. The ADC 354 includes one or more differential amplifiers constructed according to the present disclosure.

Figure 4:
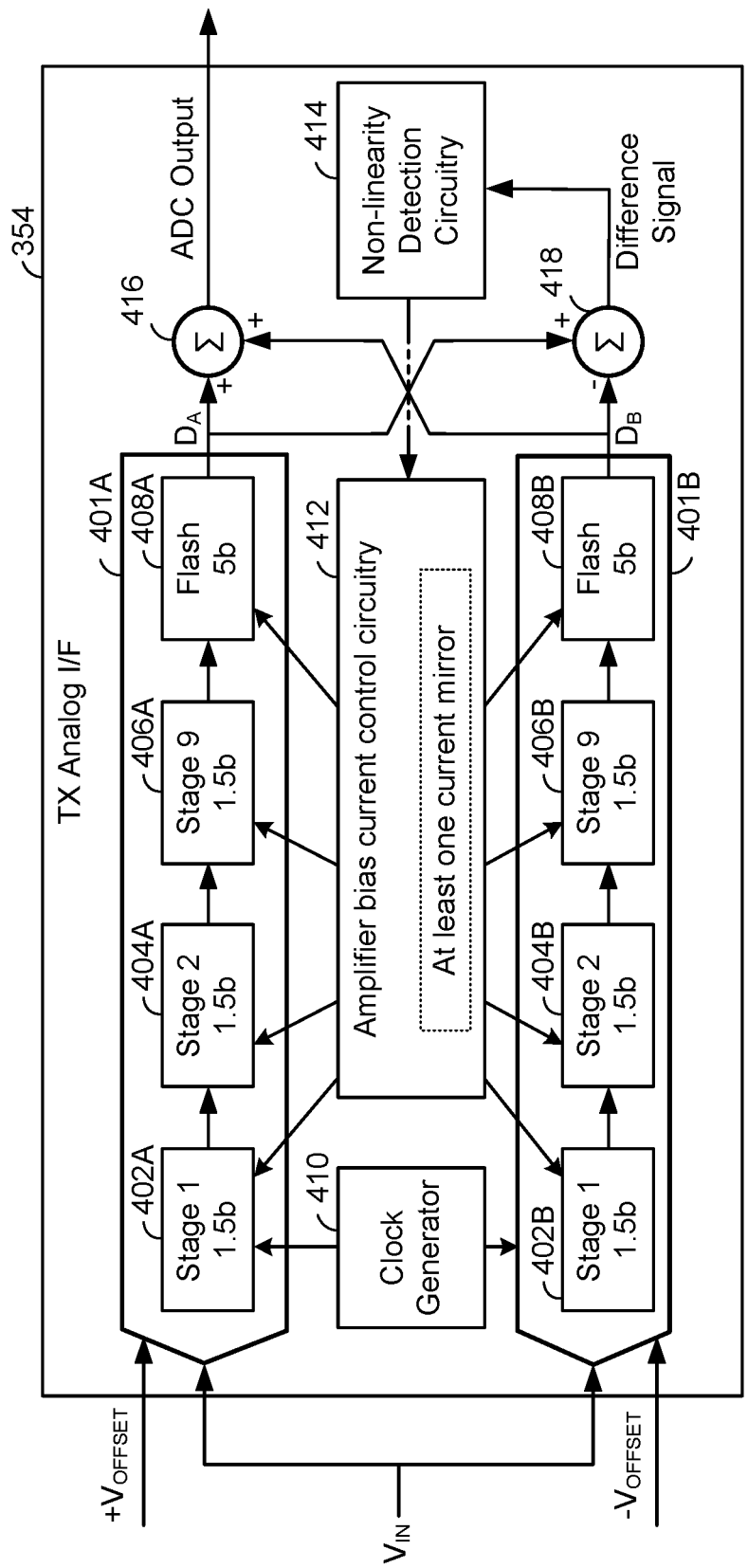
FIG. 4 is a block diagram illustrating an Analog to Digital Converter (ADC) that includes differential amplifiers constructed according to one or more embodiments of the present disclosure.

FIG. 4 is a block diagram illustrating an ADC that includes differential amplifiers constructed according to one or more embodiments of the present disclosure. The ADC 354 includes a first signal path 401A, a second signal path 401B, a clock generator 410, amplifier bias current control circuitry 412, non-linearity detection circuitry 414, and difference signal detection circuitry. In the illustrated embodiment, both the first signal path 401A and the second signal path 401B operate on differential signals.

The first signal path 401A includes stage 1 amplifier(s) 402A, stage 2 amplifier(s) 404A, stage 9 amplifier(s) 406A, and flash circuitry 408A. The second signal path 401B includes stage 1 amplifier(s) 402B, stage 2 amplifier(s)

404B, stage 9 amplifier(s) 406B, and flash circuitry 408B. The first signal path 401A receives a positive offset voltage $+V_{OFFSET}$ and the second signal path 401B receives a negative offset voltage $-V_{OFFSET}$. Both the first signal path 401A and the second signal path 401B receive an analog input voltage signal $V_{IN}$. Using the $+V_{OFFSET}$ signal, the first signal path 401A operates upon a first offset version of the voltage signal $V_{IN}$. Further, using the $-V_{OFFSET}$ signal, the second signal path 401B operates upon a second offset version of the voltage signal $V_{IN}$. In other words, both the first signal path 401A and the second signal path 401B process the same signal with differing transfer functions.

The clock generator 410 produces a clocking frequency (corresponding to a sampling clock period) for the first signal path 401A and the second signal path 401B, which is typically at least twice the frequency of the highest frequency of interest in the input voltage signal $V_{IN}$. Multiple of the stages in the first signal path 401A and the second signal path 401B include differential amplifiers that amplify signals within the respective signal paths. At least some of these differential amplifiers are constructed according to one or more embodiments of the present disclosure. These differential amplifiers are controlled by the amplifier bias current control circuitry 412. The clock generator 410 produces an operational clock for these differential amplifiers according to a reset period and an amplification period. During the reset period the differential amplifiers are prepared for the amplification period. Bias currents of the differential amplifiers are controlled by the amplifier bias current control circuitry 412 so that the differential amplifiers operate linearly over their full input ranges during the amplification period. The manner in which these differential amplifiers are constructed and operate is described further with reference to FIGS. 5-10.

The non-linearity detection circuitry 414 receives a difference signal that provides an indication on the linearity of the first signal path 401A and the second signal path 401B. This difference signal is created by summing components 416 and 418 based upon an output $D_A$ of the first signal path 401A and an output $D_B$ of the second signal path 401B. The non-linearity detection circuitry 414 processes the difference signal and provides an adjustment signal to the amplifier bias current control circuitry 412. The non-linearity detection circuitry 414 is analog circuitry, digital circuitry, or a combination of analog and digital circuitry. The adjustment signal is used by the amplifier bias current control circuitry 412 to adjust the bias current of one or more of the differential amplifiers of the first signal path 401A and the second signal path 401B.

Figure 5:
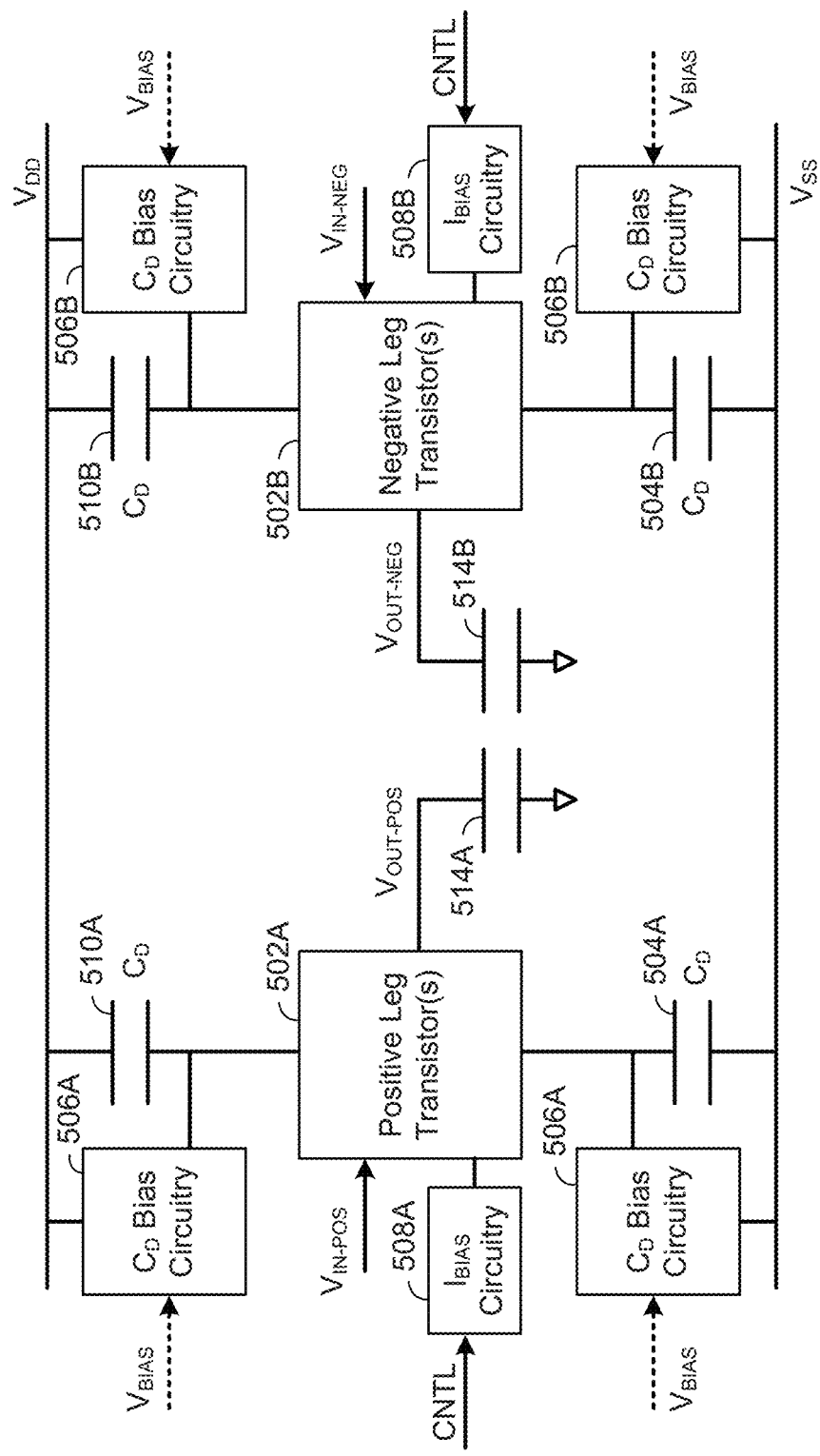
FIG. 5 is a circuit diagram illustrating an embodiment of a differential amplifier constructed and operating according to the present disclosure.

FIG. 5 is a circuit diagram illustrating an embodiment of a differential amplifier constructed and operating according to the present disclosure. The differential amplifier 500 includes a positive leg, a negative leg, and biasing circuitry. The positive leg has at least one positive leg transistor 502A. The positive leg also includes a first positive leg degeneration capacitor 504A coupled between the at least one positive leg transistor 502A and ground $V_{SS}$. Further, the positive leg also includes positive leg degeneration capacitor biasing circuitry 506A configured to bias the first positive leg degeneration capacitor 504A during a reset period. With the embodiment of FIG. 5, the positive leg degeneration capacitor biasing circuitry 506A either discharges the first positive leg degeneration capacitor 504A during the reset period or biases the first positive leg degeneration capacitor 504A to $V_{BIAS}$ during the reset period. During an amplification period, the positive leg degeneration capacitor biasing circuitry 506A allows the first positive leg degeneration capacitor 504A to float with the at least one positive leg transistor 502A.

The negative leg has at least one negative leg transistor 502B. The negative leg also includes a first negative leg degeneration capacitor 504B coupled between the at least one negative leg transistor 502B and ground $V_{SS}$. Further, the negative leg also includes negative leg degeneration capacitor biasing circuitry 506B configured to bias the first negative leg degeneration capacitor 504B during the reset period. With the embodiment of FIG. 5, the negative leg degeneration capacitor biasing circuitry 506B either discharges the first negative leg degeneration capacitor 504B during the reset period or biases the first negative leg degeneration capacitor 504B to $V_{BIAS}$ during the reset period. During an amplification period, the negative leg degeneration capacitor biasing circuitry 506B allows the first negative leg degeneration capacitor 504B to float with the at least one negative leg transistor 502B.

The biasing circuitry includes positive leg biasing circuitry 508A and negative leg biasing circuitry 508B. The positive leg biasing circuitry 508A is configured to bias current of the at least one positive leg transistor 502A to meet an optimum linearity point, with the bias current based on capacitance of the first positive leg degeneration capacitor 504A and a sampling time that occurs during the amplification period (at the end of the amplification period in some embodiments). The negative leg biasing circuitry 508B is configured to bias current of the at least one negative leg transistor 502B to meet the optimum linearity point, with the current based on capacitance of the first negative leg degeneration capacitor 504B and the sampling time that occurs during the amplification period (at the end of the amplification period in some embodiments). The manner in which the optimum linearity point relates to the operation of the amplifier is described further with reference to FIG. 7.

The biasing circuitry may include one or more current mirrors that are controlled by the amplifier bias current control circuitry 412 to set bias currents for the positive and negative legs. With the embodiment of FIG. 5, the positive leg biasing circuitry 508A receives a control signal CNTL, which controls bias current of the at least one positive leg transistor 502A. The at least one positive leg transistor 502A receives input signal $V_{IN-POS}$, the positive phase differential voltage signal, and produces an amplified positive phase differential voltage signal at the positive phase output capacitor 514A coupled thereto. Likewise, the negative leg biasing circuitry 508B receives a control signal CNTL (different for positive and negative phases in some embodiments, same in other embodiments), which controls bias current of the at least one negative leg transistor 502B. The at least one negative leg transistor 502B receives input signal $V_{IN-NEG}$, the negative phase differential voltage signal, and produces an amplified negative phase differential voltage signal at the negative phase output capacitor 514B coupled thereto.

The differential amplifier of FIG. 5 further includes a second positive leg degeneration capacitor 510A coupled between the at least one positive leg transistor 502A and supply voltage $V_{DD}$. Further, the differential amplifier also includes a second negative leg degeneration capacitor 510B coupled between the at least one negative leg transistor 502B and the supply voltage $V_{DD}$. With this embodiment, the positive leg degeneration capacitor biasing circuitry 506A is further configured to bias the second positive leg degeneration capacitor 510A to a bias voltage (or to discharge the capacitor 510A) during the reset period and to allow the second positive leg degeneration capacitor to float with the at least one positive leg transistor 502A during the amplification period.

Likewise, with this embodiment, the negative leg degeneration capacitor biasing circuitry 506B is further configured to bias the second negative leg degeneration capacitor 510B to a bias voltage (or to discharge the capacitor 510B) during the reset period and to allow the second negative leg degeneration capacitor 510B to float during the amplification period. In some embodiments, biasing of some or all of the degeneration capacitors 504A, 510A, 504B, and 510B may include being partially or fully discharged during the reset period.

The differential amplifier also includes, in the illustrated embodiment, a positive leg output capacitor 514A coupled between the at least one positive leg transistor 502A and ground. Further, the differential amplifier further includes a negative leg output capacitor 514B coupled between the at least one positive leg transistor 502A and ground.

The at least one positive leg transistor 502A may include a pair of transistors coupled as a push-pull pair while the at least one negative leg transistor 502B may include a pair of transistors coupled as a push-pull pair. These transistors are FETs and may be P-type and N-type CMOS transistors, or other types of transistors. The differential amplifier may be a stage amplifier of an ADC with the amplification period is based upon a sampling clock period of the ADC. In such case, the amplification period can be half of the ADC clock period. Further, the first and second positive leg degeneration capacitors 504A and 510A and the first and second negative leg degeneration capacitors 504B and 510B may be constructed as a plurality of capacitors. Such plurality of capacitors may be arranged in parallel, may include switching circuitry that is configured to alter the total capacitance of such multiple capacitor configurations, and may be structured that some of the capacitors are discharged or biased during the reset period while others of the capacitors are not discharged or biased.

The biasing circuitry may include one or more current mirrors that are controlled by the amplifier bias current control circuitry 412 to set bias currents for the positive and negative legs. With the embodiment of FIG. 6, the positive leg biasing circuitry receives a control signal CNTL, and produces bias voltage $V_b$, which controls bias current of the positive leg transistor 602A. The positive leg transistor 602A receives the bias voltage $V_b$ and the positive phase input signal $V_{IN\text{-}POS}$, and produces an amplified positive phase differential voltage signal at the positive phase output capacitor 614A coupled thereto. Likewise, the negative leg biasing circuitry receives a control signal CNTL, and produces the bias voltage $V_b$, which controls bias current of the negative leg transistor 602B. The negative leg transistor 602B receives the bias voltage $V_b$ and the negative phase input signal $V_{IN\text{-}NEG}$, and produces an amplified negative phase differential voltage signal at the negative phase output capacitor 614B coupled thereto.

Figure 6:
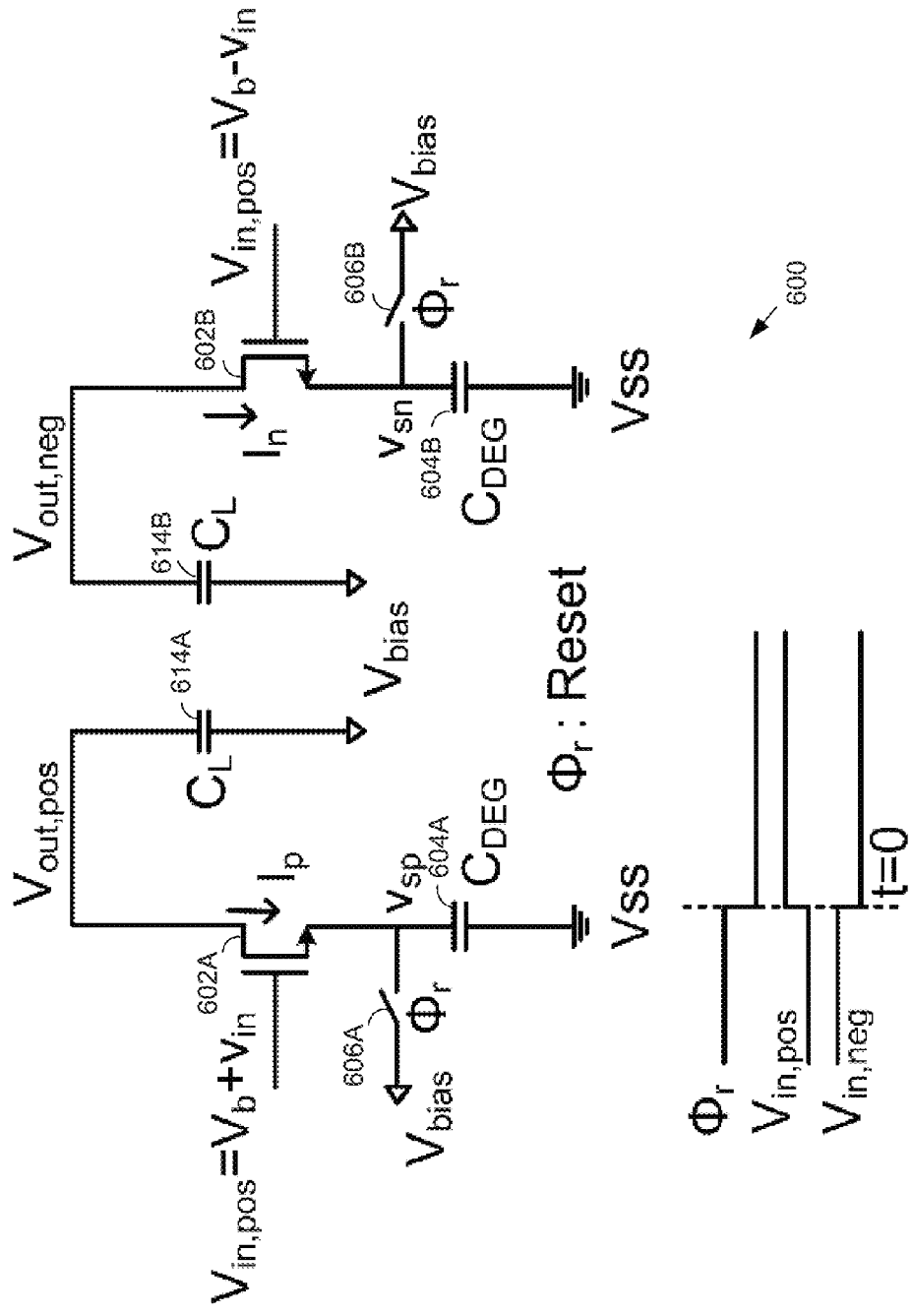
FIG. 6 is a circuit diagram illustrating a second embodiment of a differential amplifier constructed and operating according to the present disclosure.

FIG. 6 is a circuit diagram illustrating a second embodiment of a differential amplifier constructed according to an embodiment of the present disclosure. The differential amplifier 600 includes a positive leg, a negative leg, and biasing circuitry. The positive leg has a positive leg transistor 602A having a drain side and a source side. The positive leg also includes a positive leg degeneration capacitor 604A coupled between the source side of the positive leg transistor 602A and ground $V_{SS}$. Further, the positive leg also includes positive leg degeneration capacitor biasing circuitry 606A configured to bias the positive leg degeneration capacitor 604A to $V_{BIAS}$ during a reset period. During an amplification period, the positive leg degeneration capacitor biasing circuitry 606A allows the non-grounded side of the positive leg degeneration capacitor 604A to float with the source of the positive leg transistor 602A.

The negative leg has a negative leg transistor 602B having a drain side and a source side. The negative leg also includes a negative leg degeneration capacitor 604B coupled between the source side of the negative leg transistor 602B and ground $V_{SS}$. Further, the negative leg also includes negative leg degeneration capacitor biasing circuitry 606B configured to bias the negative leg degeneration capacitor 604B to $V_{BIAS}$ during the reset period. During an amplification period, the negative leg degeneration capacitor biasing circuitry 606B allows the non-grounded side of the negative leg degeneration capacitor 604B to float with the source of the negative leg transistor 602B.

The biasing circuitry includes positive leg biasing circuitry (not shown) and negative leg biasing circuitry (not shown). The positive leg biasing circuitry is configured to bias current of the positive leg transistor 602A to meet an optimum linearity point, with the bias current based on capacitance of the positive leg degeneration capacitor 604A and a sampling time that occurs during the amplification period (at the end of the amplification period in some embodiments). The negative leg biasing circuitry is configured to bias current of the negative leg transistor 602B to meet an optimum linearity point, with the bias current based on capacitance of the negative leg degeneration capacitor 604B and a sampling time that occurs during the amplification period (at the end of the amplification period in some embodiments). The manner in which the sampling time relates to the amplification period and reset period is described further with reference to FIG. 7. The biasing circuitry may include one or more current mirrors that are controlled by the amplifier bias current control circuitry 412 to set the bias current.

The differential amplifier also includes, in the illustrated embodiment, a positive leg output capacitor 614A coupled between a drain of the positive leg transistor 602A and $V_{BIAS}$. Further, the differential amplifier further includes a negative leg output capacitor 614B coupled between a drain of the negative leg transistor 602B and $V_{BIAS}$. In FIG. 6, a reset signal Φr is high during the reset period and low during the amplification period. The boundary between the reset period and the amplification period is when Φr transitions from high to low. Thus, with Φr high during the reset period, the first positive leg degeneration capacitor biasing circuitry 606A biases the first positive leg degeneration capacitor 604A to $V_{BIAS}$. During the amplification period with Φr low, the first positive leg degeneration capacitor biasing circuitry 606A allows the non-grounded side of the positive leg degeneration capacitor 604A to float with the source side of the positive leg transistor 602A. Further, with Φr high during the reset period, the negative leg degeneration capacitor biasing circuitry 606B biases the negative leg degeneration capacitor 604B to $V_{BIAS}$. During the amplification period with Φr low, the negative leg degeneration capacitor biasing circuitry 606B allows the source side of the negative leg degeneration capacitor 604B to float with the source side of the negative leg transistor 602B.

Figure 7:
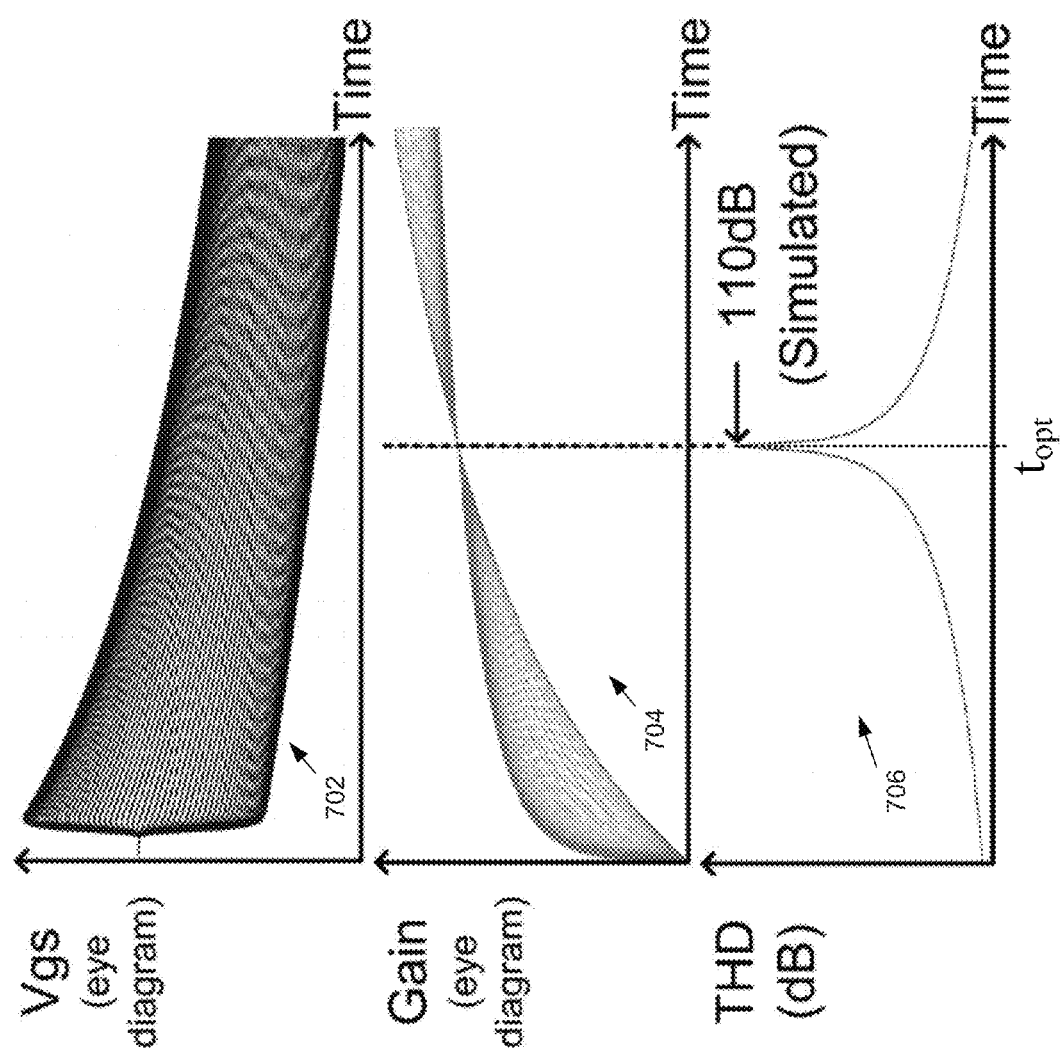
FIG. 7 is a diagram including three different graphs illustrating operation of one or more amplifiers constructed and operating according to one or more embodiments of the present disclosure.

FIG. 7 is a diagram including three different graphs illustrating operation of one or more amplifiers constructed according to one or more embodiments of the present disclosure. The graph 702 of FIG. 7 is an eye diagram illustrating the gate to source voltage $V_{GS}$ of the positive leg transistor 602A or negative leg transistor 602B of the differential amplifier 600 of FIG. 6 during an amplification period (and beyond the sampling time in some aspects) for various input voltages. Because of the charging of the degeneration capacitor 604A or 604B, $V_{GS}$ of the positive leg transistor 602A or negative leg transistor 602B decreases during the amplification period.

The graph 704 of FIG. 7 is an eye diagram illustrating the gain of the differential amplifier (one of the positive leg transistor 602A or the negative leg transistor 602B) over time during the amplification period. During the amplification period, the operational phase current charges the degeneration capacitors 604A and 604B and voltage at $V_{SP}$ goes up. $V_{GS}$ goes down as $V_{SP}$ goes up. $V_{GS}$ goes down over time because of charging of the degeneration capacitors 604A and 604B. At one particular time, the gain is exactly linear. The graph 704 shows that for different input voltages, the gain at one time during the amplification period is the same for all input voltages. At other points the gain changes based upon input voltage. Expansion left of THD max (best linearity) is expansion (higher gain for higher input V) and to the right of THD max is compression (lower gain for higher input V).

With any amplifier it is desired to have linear gain for all operating ranges of the input voltage $V_{IN}$. The voltage between the source of the positive leg transistor 602A (or negative leg transistor 602B) and ground ($V_{SS}$) of the differential amplifier of FIG. 6 is modeled by Equation (1):

$$v_{sp} = \frac{V_T}{n} \ln\left[1 + \frac{nI_{b0}t}{C_{DEG}V_T} \exp\left(\frac{nv_{in}}{V_T}\right)\right] \quad \text{Equation (1)}$$

Thus, the differential amplifier is not linear across all input voltages. However, if the term $$\frac{nI_{b0}t}{C_{DEG}V_T} = 1,$$

the differential amplifier becomes perfectly linear. To cause the differential amplifier to be perfectly linear at a sampling time, $t_{opt}$, the transistor 602A or 602B must have its channel current biased according to:

$$I_{b0,opt} = C_{DEG} * V_T / nt_{opt} \quad \text{Equation (2)}$$

where, $t_{opt}$ is the time duration during which the amplifier is active or amplifying, with the resulting gain being equal to:

$$\text{gain} = \frac{v_{sp} - v_{sn}}{2 * v_{in}} = \frac{1}{2} \quad \text{Equation (3)}$$

With this biasing current, nonlinearity cancellation is perfect at the sampling time $t_{opt}$. Further, the gain of the differential amplifier 600 from input to output is exactly $(0.5*C_{DEG}/C_L)$ at the point of cancellation (sampling time $t_{opt}$). Deviation of linearity at the point of cancellation can be detected in the digital realm by the non-linearity detection circuitry 414 and then feedback in the analog domain to the amplifier bias current control circuitry 412 for correction. Digital power needed for detection is negligible since it can be done in a subsampling manner. As shown in graph 706, with the transistor 602A and 602B biased according to Equation (2), the differential amplifier performs optimally at $t_{opt}$. Further, according to the present invention, the sampling time may correspond to an end of the amplification period.

Figure 8:
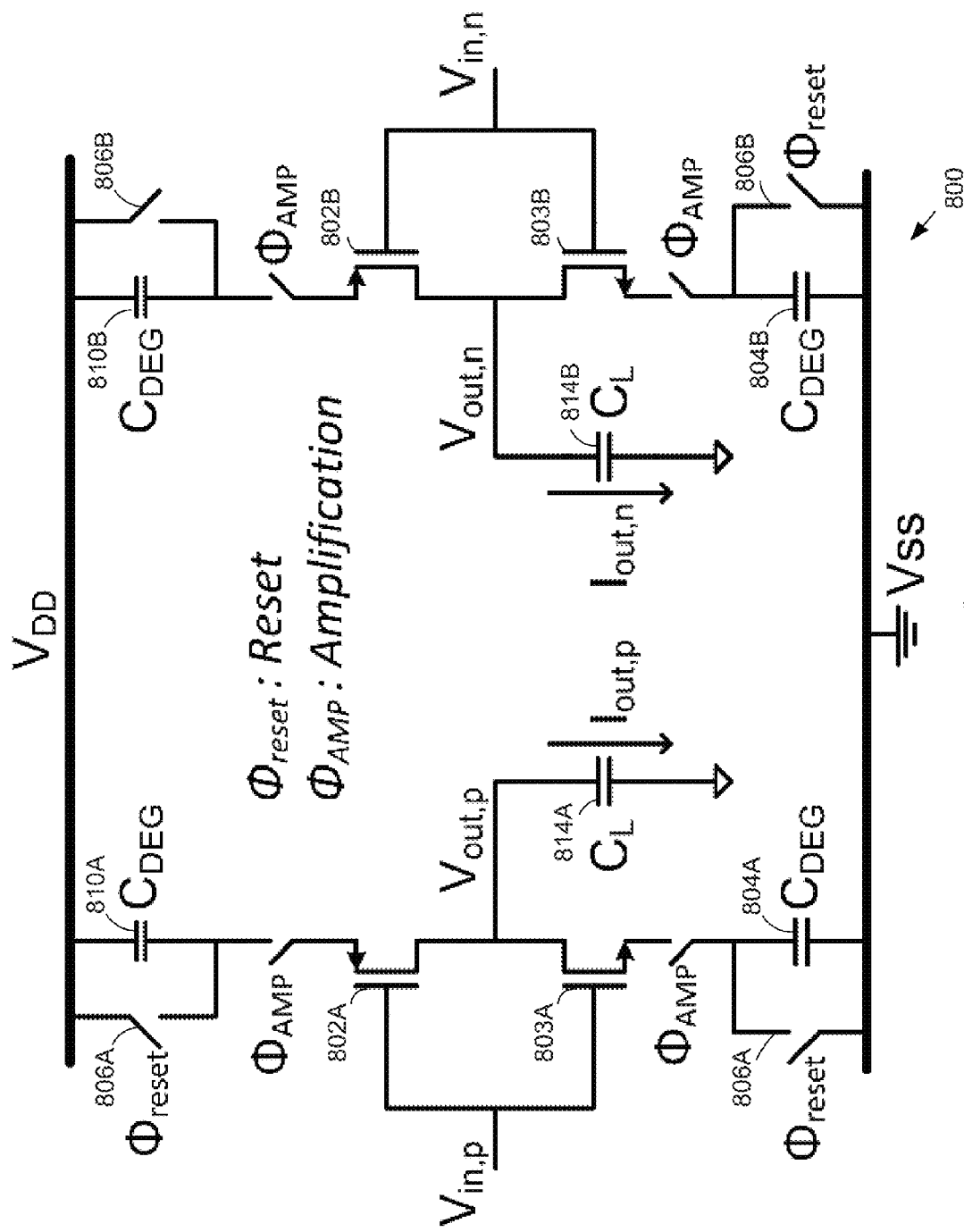
FIG. 8 is a circuit diagram illustrating a third embodiment of a differential amplifier constructed and operating according to the present disclosure.

FIG. 8 is a circuit diagram illustrating a third embodiment of a differential amplifier constructed according to an embodiment of the present disclosure. The differential amplifier 800 includes a positive leg, a negative leg, and biasing circuitry. The positive leg includes P-type transistor 802A and N-type transistor 803A coupled in a push pull configuration with their drains tied. The positive leg also includes a first positive leg degeneration capacitor 804A coupled between the source of the positive leg transistor 803A and ground $V_{SS}$. The positive leg further includes a second positive leg degeneration capacitor 810A coupled between the source of positive leg transistor 802A and voltage $V_{DD}$. Further, the positive leg also includes positive leg degeneration capacitor biasing circuitry 806A configured to discharge the first positive leg degeneration capacitor 804A and the second positive leg degeneration capacitor 810A during a reset period. The positive leg degeneration capacitor biasing circuitry 806A also allows the first positive leg degeneration capacitor 804A and the second positive leg degeneration capacitor 810A to float during an amplification period.

The negative leg includes P-type transistor 802B and N-type transistor 803B coupled in a push pull configuration with their drains tied. The negative leg also includes a first negative leg degeneration capacitor 804B coupled between the source of the negative leg transistor 803B and ground $V_{SS}$. The negative leg further includes a second negative leg degeneration capacitor 810B coupled between the source of negative leg transistor 802B and voltage $V_{DD}$. Further, the negative leg also includes negative leg degeneration capacitor biasing circuitry 806B configured to discharge the first negative leg degeneration capacitor 804B and the second negative leg degeneration capacitor 810B during a reset period. The negative leg degeneration capacitor biasing circuitry 806B also operates to allow the first negative leg degeneration capacitor 804B and the second negative leg degeneration capacitor 810B to float during the amplification period.

The biasing circuitry includes positive leg biasing circuitry (not shown) and negative leg biasing circuitry (not shown). The positive leg biasing circuitry is configured to bias current of the positive leg transistors 802A and 803A based on capacitance of the first positive leg degeneration capacitor 804A, the capacitance of the second positive leg degeneration capacitor 810A, and a sampling time during the amplification period. The negative leg biasing circuitry is configured to bias current of the negative leg transistors 802B and 803B based on capacitance of the first negative leg degeneration capacitor 804B, the second negative leg degeneration capacitor 810B, and a sampling time during the amplification period. The manner in which the sampling time relates to the amplification period and the reset period is described further with reference to FIG. 7.

The biasing circuitry may include one or more current mirrors that are controlled by the amplifier bias current control circuitry 412 to set bias currents for the positive and negative legs. With the embodiment of FIG. 8, the positive leg biasing circuitry receives a control signal CNTL and biases transistors 802A and 803A to produce a desired $I_{BIAS}$. An amplified positive phase differential voltage signal is produced at the positive phase output capacitor 814A coupled to the drains of positive leg transistors 802A and 803A. Likewise, the negative leg biasing circuitry receives a control signal CNTL and biases the transistors 802B and 803B to produce a desired $I_{BIAS}$. An amplified negative phase differential voltage signal is produced at the negative phase output capacitor 814B coupled to the drains of negative leg transistors 802B and 803B.

The differential amplifier also includes, in the illustrated embodiment, a positive leg output capacitor 814A coupled between the drains of the positive leg transistors 802A, 803A and ground. Further, the differential amplifier also includes, in the illustrated embodiment, a negative leg output capacitor 814B coupled between the drains of the negative leg transistors 802B, 803B and ground.

Figure 9:
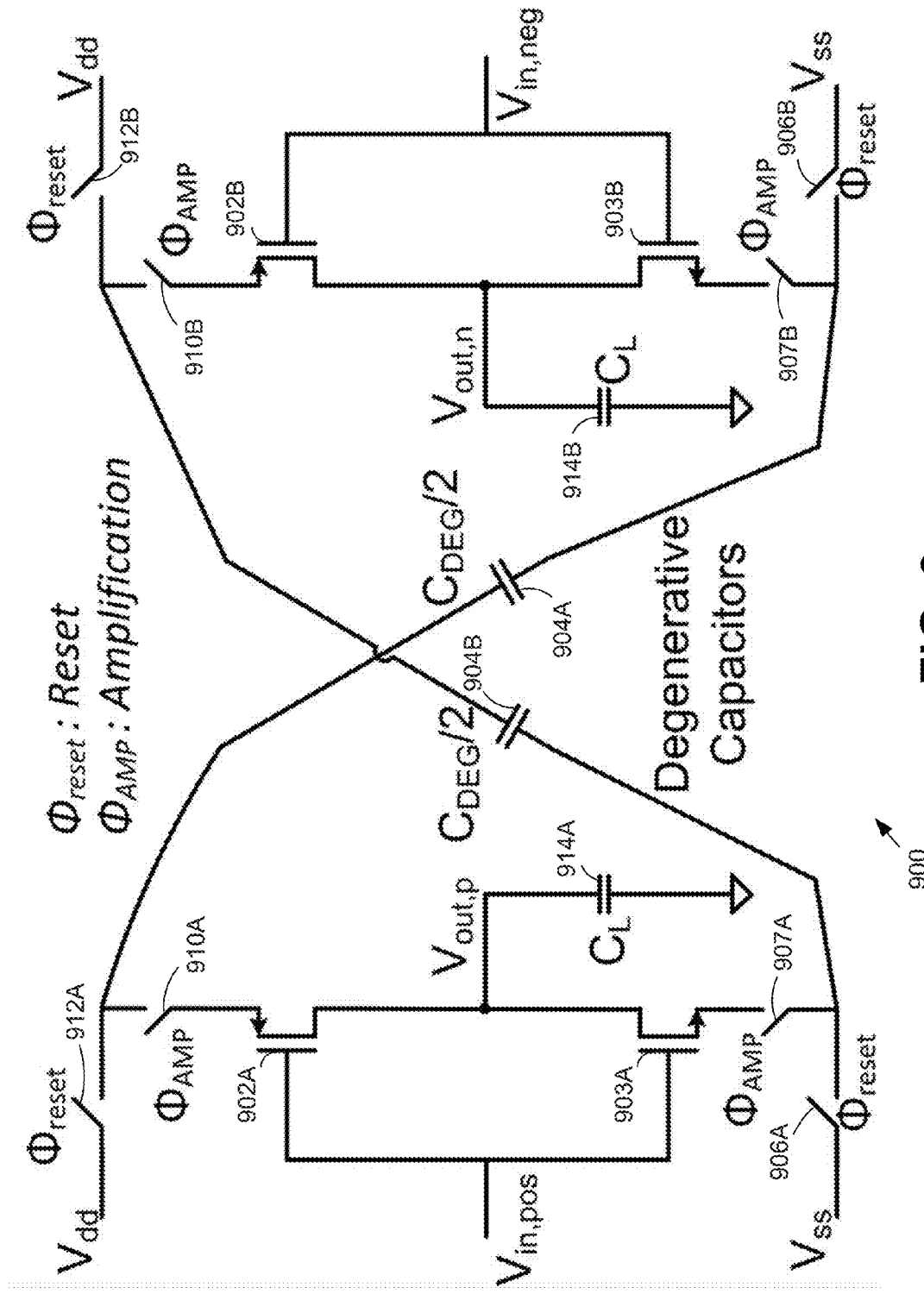
FIG. 9 is a circuit diagram illustrating a fourth embodiment of a differential amplifier constructed and operating according to the present disclosure.

FIG. 9 is a circuit diagram illustrating a fourth embodiment of a differential amplifier constructed according to the present disclosure. The differential amplifier 900 includes a positive leg and a negative leg. The positive leg includes positive leg transistors 902A, which may be P-type, and 903A, which may be N-type, coupled together in a push pull configuration. The positive leg further includes first positive leg degeneration capacitor switching circuitry 906A and 907A and second positive leg degeneration capacitor switching circuitry 910A and 912A. The negative leg includes negative leg transistors 902B, which may be P-type, and 903B, which may be N-type, coupled together in a push pull configuration, first negative leg degeneration capacitor switching circuitry 906B and 907B and second negative leg degeneration capacitor switching circuitry 910B and 912B.

The differential amplifier also includes first 904A and second 904B degeneration capacitors. The first degeneration capacitor 904A couples between the second positive leg degeneration capacitor switching circuitry 910A and 912A and the first negative leg degeneration capacitor switching circuitry 906B and 907B. The second degeneration capacitor 904B couples between the first positive leg degeneration capacitor switching circuitry 906A and 907A and the second negative leg degeneration capacitor switching circuitry 910B and 912B. During the reset period, both the first 904A and second 904B degeneration capacitors are coupled between $V_{DD}$ and $V_{SS}$ by the closing of switches 906A, 912A, 906B and 912B and the opening of switching circuitry 907A, 910A, 907B, and 910B. During the amplification period, the first degeneration capacitor 904A is coupled between the source of transistor 902A and the source of transistor 903B by the opening of switches 912A and 906B and the closing of switches 910A and 907B. Further, during the amplification period, the second degeneration capacitor 904B is coupled between the source of transistor 902B and the source of transistor 903A by the opening of switches 912B and 906A and the closing of switches 910B and 907A.

The differential amplifier 900 also includes a positive leg output capacitor 914A coupled between the drains of positive leg transistors 902A and 903A and ground. Further, the differential amplifier 900 also includes a negative leg output capacitor 914B coupled between the drains of the negative leg transistors 902B and 903B and ground.

The biasing circuitry includes positive leg biasing circuitry (not shown) and negative leg biasing circuitry (not shown). The positive leg biasing circuitry is configured to bias current of the positive leg transistors 902A and 903A based on capacitance of the degeneration capacitors 904A and 904B and a sampling time, $t_{opt}$, during the amplification period. The negative leg biasing circuitry is configured to bias current of the a negative leg transistors 902B and 903B based on capacitance of the degeneration capacitors 904A and 904B and the sampling time, $t_{opt}$, during the amplification period. The manner in which the sampling time, $t_{opt}$, relates to the amplification period is described with reference to FIG. 7.

The biasing circuitry may include one or more current mirrors that are controlled by the amplifier bias current control circuitry 412 to set bias currents for the positive and negative legs. With the embodiment of FIG. 9, the positive leg biasing circuitry receives a control signal CNTL and biases transistors 902A and 903A to produce a desired $I_{BIAS}$. An amplified positive phase differential voltage signal is produced at the positive phase output capacitor 914A coupled to the drains of positive leg transistors 902A and 903A. Likewise, the negative leg biasing circuitry receives a control signal CNTL and biases the transistors 902B and 903B to produce a desired $I_{BIAS}$. An amplified negative phase differential voltage signal is produced at the negative phase output capacitor 914B coupled to the drains of negative leg transistors 902B and 903B.

Figure 10:
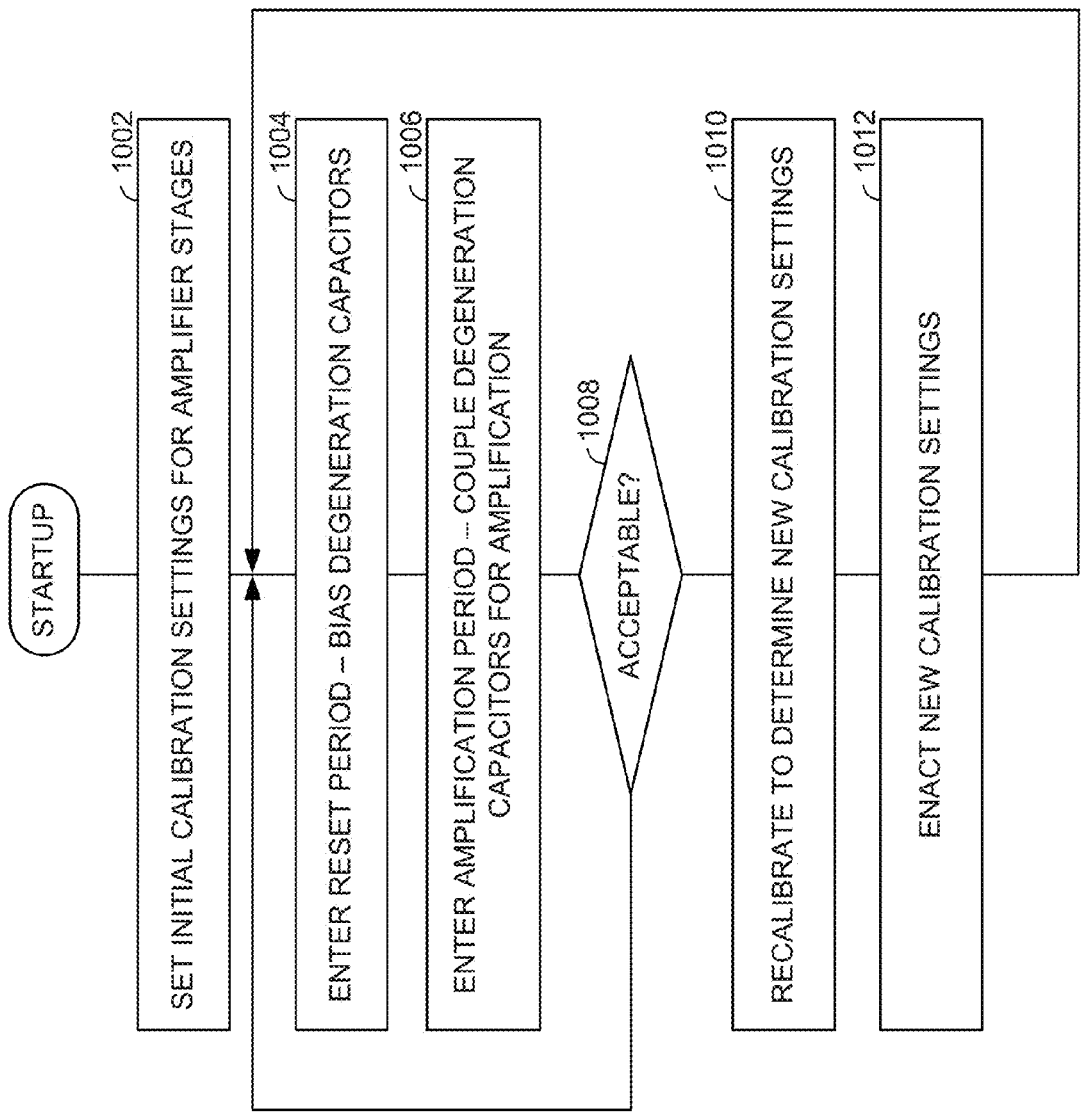
FIG. 10 is a flow chart illustrating operation of a differential amplifier according to an embodiment of the present disclosure.

FIG. 10 is a flow chart illustrating operation of a differential amplifier according to an embodiment of the present disclosure. Operation 1000 commences during an initial calibration stage (step 1002) where bias settings for transistors of the amplifier stage(s) are set. These initial settings may be based upon prior operations, factory setting, prior calibration operations, or other input. Operation continues, during a reset period (step 1004), with discharging at least one positive leg degeneration capacitor and discharging at least one negative leg degeneration capacitor. In other embodiments the degeneration capacitors may be biased to a bias voltage $V_{BIAS}$. Operation continues, during an amplification period (step 1006) of allowing the at least one positive leg degeneration capacitor to float with its coupled positive leg transistor(s) and allowing the at least one negative leg degeneration capacitor to float with its coupled negative leg transistor(s). The amplification period (step 1006) operations include applying a positive phase differential voltage signal to a gate of the at least one positive leg transistor and applying a negative phase differential voltage signal to a gate of the at least one negative leg transistor. Step 1006 includes biasing current of the at least one positive leg transistor based on capacitance of the at least one positive leg degeneration capacitor and a sampling time during the amplification period and biasing current of the at least one negative leg transistor based on capacitance of the at least one negative leg degeneration capacitor and the sampling time during the amplification period.

After an operation of the amplification period it is determined whether the linearity of the differential amplifier is acceptable (step 1008). Such determination may be performed periodically or upon another criterion. If at step 1008 it is determined that the current biasing currents are acceptable, operation returns to step 1004. If not acceptable, new calibration settings are determined a step 1010 and enacted at step 1012. From step 1012, operation returns to step 1004.

The present disclosure has been described, at least in part, in terms of one or more embodiments. An embodiment of the present disclosure is used herein to illustrate the present disclosure, an aspect thereof, a feature thereof, a concept thereof, and/or an example thereof. A physical embodiment of an apparatus, an article of manufacture, a machine, and/or of a process that embodies the present disclosure may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

The present disclosure has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed disclosure. One of average skill in the art will also recognize that the functional building blocks, and other illustrative blocks, modules and components herein, can be implemented as illustrated or by discrete components, application specific integrated circuits, processors executing appropriate software and the like or any combination thereof.

What is claimed is:

1. A differential amplifier comprising:
a positive leg having:
at least one positive leg transistor;
a first positive leg degeneration capacitor coupled between the at least one positive leg transistor and ground; and
positive leg degeneration capacitor biasing circuitry configured to bias the first positive leg degeneration capacitor during a reset period;
a negative leg having:
at least one negative leg transistor;
a first negative leg degeneration capacitor coupled between the at least one negative leg transistor and ground; and
negative leg degeneration capacitor biasing circuitry configured to bias the first negative leg degeneration capacitor during the reset period; and
positive leg bias circuitry configured to bias current of the at least one positive leg transistor based on capacitance of the first positive leg degeneration capacitor and a sampling time during an amplification period; and
negative leg bias circuitry configured to bias current of the at least one negative leg transistor based on capacitance of the first negative leg degeneration capacitor and the sampling time during the amplification period, wherein,
the differential amplifier is a stage amplifier of an analog to digital converter (ADC); and
the amplification period is based upon a sampling clock period of the ADC.

2. The differential amplifier of claim 1, further comprising:
a positive leg output capacitor coupled between the at least one positive leg transistor and ground; and
a negative leg output capacitor coupled between the at least one negative leg transistor and ground.

3. The differential amplifier of claim 1:
wherein the at least one positive leg transistor comprises a pair of transistors coupled as a push-pull pair; and
wherein the at least one negative leg transistor comprises a pair of transistors coupled as a push-pull pair.

4. The differential amplifier of claim 3, further comprising:
a positive leg output capacitor coupled between the pair of transistors of the positive leg and ground; and
a negative leg output capacitor coupled between the pair of transistors of the negative leg and ground.

5. The differential amplifier of claim 1:
further comprising:
a second positive leg degeneration capacitor coupled between the at least one positive leg transistor and a supply voltage; and
a second negative leg degeneration capacitor coupled between the at least one negative leg transistor and the supply voltage; and
wherein:
the positive leg degeneration capacitor biasing circuitry is further configured to bias the second positive leg degeneration capacitor to a bias voltage during the reset period and to allow the second positive leg degeneration capacitor to float during the amplification period; and
the negative leg degeneration capacitor biasing circuitry is further configured to bias the second negative leg degeneration capacitor to a bias voltage during the reset period and to allow the second negative leg degeneration capacitor to float during the amplification period.

6. The differential amplifier of claim 1, wherein the amplification period is one half of the sampling clock period of the ADC.

7. The differential amplifier of claim 1, wherein at least one of the first positive leg degeneration capacitor and the first negative leg degeneration capacitor comprises a plurality of capacitors.

8. The differential amplifier of claim 1, wherein the biasing circuitry comprises at least one current mirror.

9. A differential amplifier comprising:
a positive leg having:
at least one positive leg transistor;
a positive leg output capacitor coupled between the at least one positive leg transistor and ground;
first positive leg degeneration capacitor switching circuitry; and
second positive leg degeneration capacitor switching circuitry;
a negative leg having:
at least one negative leg transistor;
a negative leg output capacitor coupled between the at least one negative leg transistor and ground;
first negative leg degeneration capacitor switching circuitry; and
second negative leg degeneration capacitor switching circuitry;
a first degeneration capacitor coupled between the second positive leg degeneration capacitor switching circuitry and the first negative leg degeneration capacitor switching circuitry; and
a second degeneration capacitor coupled between the first positive leg degeneration capacitor switching circuitry and the second negative leg degeneration capacitor switching circuitry; and
positive leg biasing circuitry configured to bias current of the at least one positive leg transistor and negative leg biasing circuitry configured to bias the at least one negative leg transistor, the positive leg biasing circuitry and the negative leg biasing circuitry producing biasing based on capacitance of the first and second degeneration capacitors and a sampling time during an amplification period.

10. The differential amplifier of claim 9:
wherein the at least one positive leg transistor comprises a pair of transistors coupled as a push-pull pair; and wherein the at least one negative leg transistor comprises a pair of transistors coupled as a push-pull pair.

11. The differential amplifier of claim 9, wherein:
the second positive leg degeneration capacitor switching circuitry and the first negative leg degeneration capacitor switching circuitry are configured to:
couple the first degeneration capacitor between a bias voltage and ground during a reset period; and
couple the first degeneration capacitor between a first side of the at least one positive leg transistor and a second side of the at least one negative leg transistor during the amplification period; and
the second negative leg degeneration capacitor switching circuitry and the first positive leg degeneration capacitor switching circuitry are configured to:
couple the second degeneration capacitor between a bias voltage and ground during the reset period; and
couple the second degeneration capacitor between a first side of the at least one negative leg transistor and a second side of the at least one positive leg transistor during the amplification period.

12. The differential amplifier of claim 9, wherein:
the differential amplifier is a stage amplifier of an analog to digital converter (ADC); and
the amplification period is based upon a sampling clock period of the ADC.

13. The differential amplifier of claim 12, wherein the amplification period is one half of the sampling clock period of the ADC.

14. A method of operating a differential amplifier comprising:
during a reset period:
discharging a first positive leg degeneration capacitor that couples between at least one positive leg transistor and ground;
discharging a first negative leg degeneration capacitor that couples between at least one negative leg transistor and ground;
during an amplification period:
enabling a first side the first positive leg degeneration capacitor to float with a source of the at least one positive leg transistor;
enabling a first side of the first negative leg degeneration capacitor to float with a source of the at least one negative leg transistor;
applying a positive phase differential voltage signal to a gate of the at least one positive leg transistor;
applying a negative phase differential voltage signal to a gate of the at least one negative leg transistor;
biasing current of the at least one positive leg transistor based on capacitance of the first positive leg degeneration capacitor and a sampling time during an amplification period; and
biasing current of the at least one negative leg transistor based on capacitance of the negative leg degeneration capacitor and the sampling time during the amplification period, wherein:
the differential amplifier is a stage amplifier of an analog to digital converter (ADC); and
the amplification period is based upon a sampling clock period of the ADC.

15. The method of claim 14, further comprising:
generating an amplified positive phase differential voltage signal at an output capacitor coupled to the at least one positive leg transistor; and
generating an amplified negative phase differential voltage signal at an output capacitor coupled to the at least one negative leg transistor.

16. The method of claim 14, further comprising:
during the reset period:
discharging a second positive leg degeneration capacitor;
discharging a second negative leg degeneration capacitor;
during an amplification period:
enabling a first side the second positive leg degeneration capacitor to float with a source of the at least one positive leg transistor; and
enabling a first side of the second negative leg degeneration capacitor to float with a source of the at least one negative leg transistor.

17. The method of claim 14, wherein the amplification period is one half of the sampling clock period of the ADC.

* * * * *